US008461922B2

(12) United States Patent
Norman

(10) Patent No.: US 8,461,922 B2
(45) Date of Patent: Jun. 11, 2013

(54) OFFSET COMPONENT CANCELATION METHOD AND CIRCUIT

(75) Inventor: Robert Alan Norman, Bloomington, MN (US)

(73) Assignee: LSI Corporation, San Jose, CA (US)

( * ) Notice: Subject to any disclaimer, the term of this patent is extended or adjusted under 35 U.S.C. 154(b) by 188 days.

(21) Appl. No.: 13/033,797

(22) Filed: Feb. 24, 2011

(65) Prior Publication Data

US 2012/0218036 A1 Aug. 30, 2012

(51) Int. Cl.
*H03F 3/45* (2006.01)
(52) U.S. Cl.
USPC .................................. 330/69; 330/86; 330/9
(58) Field of Classification Search
USPC ................................................. 330/69, 86, 9
See application file for complete search history.

(56) References Cited

U.S. PATENT DOCUMENTS

| | | | |
|---|---|---|---|
| 6,507,242 B1* | 1/2003 | Palathol Mana Sivadasan et al. | 330/86 |
| 6,956,439 B1* | 10/2005 | Devnath | 330/308 |
| 7,248,105 B2 | 7/2007 | Koen | |
| 7,377,171 B2* | 5/2008 | Glesius | 73/649 |
| 7,876,155 B2* | 1/2011 | Aroca et al. | 330/260 |
| 8,143,941 B2* | 3/2012 | Park et al. | 327/553 |
| 8,183,916 B2* | 5/2012 | Byon | 330/69 |
| 2009/0002075 A1* | 1/2009 | Chilakapati et al. | 330/297 |
| 2009/0212856 A1 | 8/2009 | Chen et al. | |

* cited by examiner

*Primary Examiner* — Patricia Nguyen
(74) *Attorney, Agent, or Firm* — Ryan, Mason & Lewis, LLP

(57) ABSTRACT

Techniques are disclosed for canceling an offset component (e.g., dc component or dc offset) in an amplifier circuit. For example, an apparatus comprises an amplifier circuit with an amplifier element and a feedback resistor network coupled between an output of the amplifier element and an input of the amplifier element. The apparatus also comprises a current source coupled to the feedback resistor network, the current source generating a current signal that generates a voltage in a first portion of the feedback resistor network that cancels an offset component present in an input signal received by the amplifier circuit. A second portion of the feedback resistor network may be adjustable so that a gain applied to the input signal is adjustable while the offset component is canceled from the input signal. One or more resistors in the feedback resistor network may be composed of the same or substantially similar material as one or more resistors associated with the current source. In such case, the voltage generated in the first portion of the feedback resistor network that cancels the offset component present in the input signal received by the amplifier circuit is independent of a temperature variation and/or a process variation.

20 Claims, 6 Drawing Sheets

OFFSET COMPONENT CANCELATION METHOD AND CIRCUIT

FIELD OF THE INVENTION

The present invention relates generally to signal amplifier circuits, and more particularly to a method and apparatus for canceling an offset component in a signal being amplified by such an amplifier circuit.

BACKGROUND OF THE INVENTION

It is known that the headroom of an amplifier circuit is a fundamental limit to the gain that can be achieved for amplifying a signal. The "headroom" typically refers to the maximum output voltage swing of the amplifier above which the output voltage clamps. If the input signal has a dc component, typically referred to as a "dc offset," then the gain of the amplifier would have to be limited in order not to exceed the allowable headroom once both the dc component and the alternating current (ac) component of the input signal are amplified by the amplifier circuit. The result is that there is an inability to optimize the ac gain due to the presence of the dc component.

Attempts at reducing input voltage offset in an amplifier circuit generally include blocking the dc component of the signal by using input capacitive coupling or by applying a voltage or current source to the inputs of the amplifier in a direction opposite to the offset voltage. Capacitive coupling has the disadvantage of requiring either external capacitors, which may be expensive, or, if combined on the substrate of an integrated circuit, will take up a large area on the die. In addition, the capacitors can have a limiting effect on the bandwidth of the input signals and also will not eliminate the effects of input offset due to mismatches in the amplifier components. The addition of voltage or current sources applied to the input signal to cancel the dc offset have the disadvantage that they only work for a fixed gain amplifier, since these signals are also amplified by the amplifier circuit.

It is therefore desirable to reduce the effects of input offset voltages on the output of an amplifier circuit while maintaining the capability of adjusting the gain.

SUMMARY OF THE INVENTION

Illustrative embodiments of the present invention meet the above-noted and other needs by providing methods and apparatus that cancel an offset component in an amplifier circuit.

For example, in accordance with one aspect of the invention, an apparatus comprises an amplifier circuit with an amplifier element and a feedback resistor network coupled between an output of the amplifier element and an input of the amplifier element. The apparatus also comprises a current source coupled to the feedback resistor network, the current source generating a current signal that generates a voltage in a first portion of the feedback resistor network that cancels an offset component present in an input signal received by the amplifier circuit.

A second portion of the feedback resistor network may be adjustable so that a gain applied to the input signal is adjustable while the offset component is canceled from the input signal.

The offset component may be a dc component or dc offset present in the input signal.

One or more resistors in the feedback resistor network may be composed of the same or substantially similar material as one or more resistors associated with the current source. In such case, the voltage generated in the first portion of the feedback resistor network that cancels the offset component present in the input signal received by the amplifier circuit is independent of a temperature variation and/or a process variation.

Advantageously, illustrative techniques of the invention reduce the effects of input offset voltages on the output of an amplifier circuit while maintaining the capability of adjusting the gain of the amplifier circuit.

These and other objects, features, and advantages of the present invention will become apparent from the following detailed description of illustrative embodiments thereof, which is to be read in connection with the accompanying drawings.

DETAILED DESCRIPTION OF THE INVENTION

Principles of the invention will be illustrated herein in conjunction with an exemplary amplifier architecture. It should be understood, however, that the invention is not limited to use with any particular amplifier architecture, and can thus be implemented with a variety of amplifier designs other than the ones that are illustratively depicted and described herein.

It is to be further understood that the following circuit descriptions are given below with reference to specific terminals, e.g., negative input terminal, positive input terminal, output terminal, positive terminal, negative terminal, first terminal, second terminal, etc., by which a given component is coupled to one or more other components. However, given the functional description herein of each of the components, and their interaction with one another also described in detail herein, one of ordinary skill in the art will realize how each component could be alternatively coupled (i.e., in comparison to what is shown and described in the context of the figures) in order to realize the advantages of the embodiments of the invention.

Figure 1:
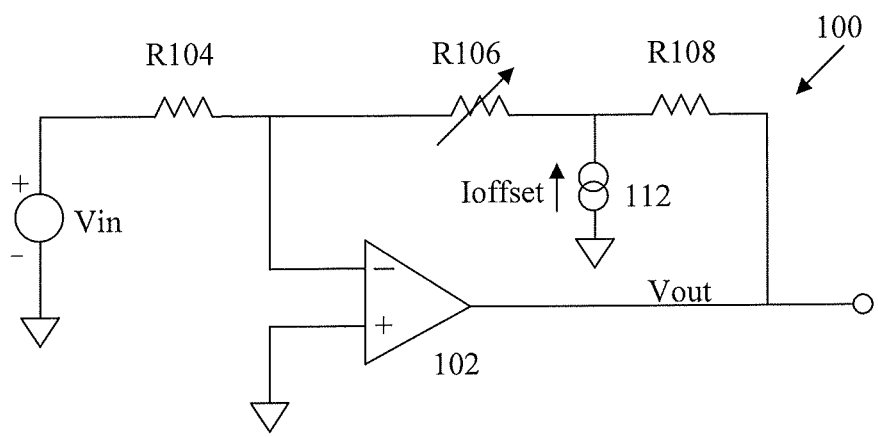
FIG. 1 shows an amplifier circuit including a dc offset cancelation feature according to a first embodiment of the invention.

FIG. 1 shows a single ended amplifier circuit 100 according to an exemplary embodiment of the invention. As shown, circuit 100 includes an operational amplifier (op-amp) 102, input resistor R104, a first feedback resistor R106, a second feedback resistor R108 and an offset current source 112. R106 and R108 are series connected feedback resistors with R106 being a variable (adjustable or programmable) resistor. The circuit 100 is coupled to an input voltage source Vin and amplifies the input signal provided by Vin in order to generate an output voltage signal Vout.

More particularly, input resistor R104 has a first terminal coupled to the negative input terminal of op-amp 102 and a second terminal coupled to the positive terminal of input voltage source Vin. R106 and R108 are coupled in series between the output and negative input of op-amp 102. That is, a first terminal of R108 is coupled to the output terminal of op-amp 102 and a first terminal of R106 is coupled to the negative input terminal of op-amp 102. A positive terminal of offset current source 112 is coupled to second terminals of R106 and R108. The positive input terminal of op-amp 102 is coupled to ground. The negative terminals of Vin and current source 112 are also coupled to ground. Note that the current source 112 generates Ioffset as will be explained in further detail below.

For an op-amp with a gain approaching infinity, a current is produced at the output of the op-amp such that the inverting input is equal to the non-inverting input. Also, for an ideal op-amp, there is infinite input impedance so no current flows in or out of either input terminal. In this case, the currents that flow in the resistor network (formed by R104, R106 and R108) are such that Kirchoff's current law is satisfied. Therefore:

$$I(R104)=Vin/R104=I(R106) \quad (1)$$

$$I(R108)=I(R104)+Ioffset \quad (2)$$

$$I(Vout)=I(R104)+Ioffset \quad (3)$$

Then, by superposition, the currents through the resistors add together to give:

$$Vout=0-I(R104)R106-I(R104)*R108-Ioffset*R108 \quad (4)$$

$$Vout=(-Vin/R104)*(R106+R108)-Ioffset*R108 \quad (5)$$

where Ioffset*R108 is the offset voltage superimposed on output voltage Vout; and where (1/R104)*(R106+R108) is the gain.

From the above equations, it is evident that the gain of the circuit can be changed, for example, by adjusting feedback resistor R106 without affecting the offset adjustment. It is also evident that the offset can be adjusted by adjusting current source 112, without affecting the gain of the circuit.

Figure 2:
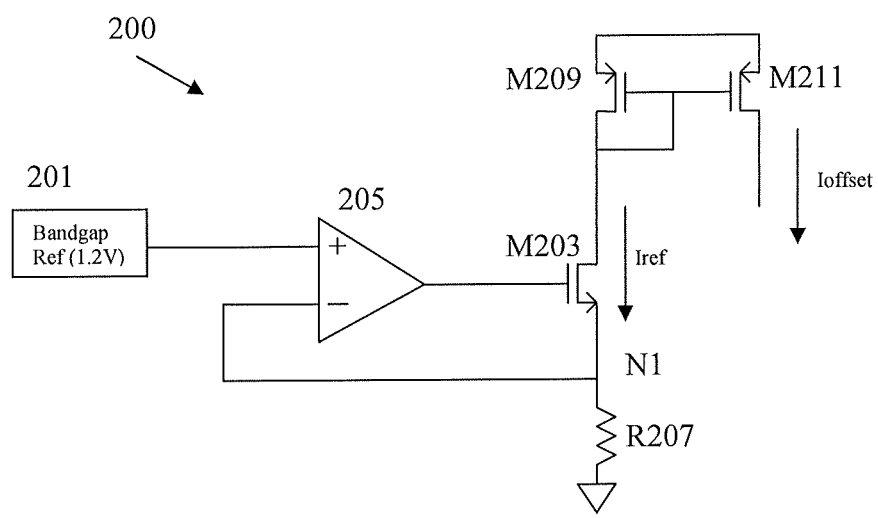
FIG. 2 shows a current reference generator circuit according to an embodiment of the invention.

FIG. 2 shows an illustrative embodiment for implementing offset current source 112. That is, in this illustrative embodiment, offset current source 112 is implemented by a reference current generator circuit 200 shown in FIG. 2. As shown, circuit 200 includes a bandgap reference voltage source 201, a NMOS (negative or n-type metal oxide semiconductor) field effect transistor (FET) M203, an op-amp 205, a resistor 207, a PMOS (positive or p-type MOS) FET M209 and an PMOS FET M211.

More particularly, an output terminal of bandgap reference voltage source 201 is coupled to the positive input terminal of op-amp 205. The output terminal of op-amp 205 is coupled to the gate terminal of M203. The source terminal of M203 is coupled to a first terminal of R207 and the negative input terminal of op-amp 205 (denoted by junction N1). The second terminal of R207 is coupled to ground. The drain terminal of M203 is coupled to the drain and gate terminals of M209 and the gate terminal of M211. The source terminals of M209 and M211 are coupled together. The drain terminal of M211 is the terminal that provides Ioffset (i.e., offset current generated by offset current source 112 in FIG. 1).

Advantageously, reference current generator 200 uses a resistor (R207) of the same or substantially similar type as used for feedback resistors R106 and R108 and input resistor R104. In an exemplary integrated circuit embodiment, the resistor 8207 in FIG. 2, used to generate the offset current, Ioffset, in the reference current generator (as will be explained in detail below), feedback resistors R106 and R108, and input resistor R104, may all be composed of, for example but not limited to, polysilicon. Therefore, as will be described below, the offset voltage developed across R108 in FIG. 1 is independent of both temperature and process variations. For example, if the process results in a lower resistance value than typical for the polysilicon material, the current Ioffset will increase. The resultant voltage offset will remain unchanged since the increase in current will compensate for the decrease in resistance of R108. Similar results occur for a temperature variation. As the temperature varies, the value of Ioffset will vary due to a change in the value of the resistance used in the reference current generator 200. Resistor R108 will change value similar to the resistor R207 used in the reference current generator such as to maintain the offset voltage across R108 as unchanged.

Thus, the offset current Ioffset can be generated by current reference generator 200 as shown in FIG. 2. A bandgap reference 201, typically producing a reference voltage of about 1.2 volts, is applied to the positive input of op-amp 205. As is well known to those ordinarily skilled in the art, the voltage produced by a bandgap reference typically remains constant over variations in process and temperature. Op-amp 205 is configured in a feedback circuit comprising transistor M203 and reference resistor 8207. The op-amp 205 and feedback circuit, as illustrated in FIG. 2, will result in the bandgap reference voltage appearing on node N1, at the junction of transistor M203 and resistor R207. A reference current Iref is thereby produced wherein Iref=(bandgap reference voltage)/R207.

This reference current Iref can thereby be adjusted by adjusting the value of R207. The reference current Iref is then mirrored from transistor M209 to transistor M211, thereby producing Ioffset, a scaled amount of the reference current Iref, to be applied to resistor R108 in the feedback circuit of FIG. 1. As mentioned above, resistor R207 is preferably composed of the same material as feedback resistor R108 (and R104 and R106) such that variations in resistance value of resistors R207 and R108 due to variations in process and temperature will track each other.

The voltage offset resulting from the offset current Ioffset through resistor R108 in FIG. 1 will remain constant due to variations of process and temperature. This is evident from the circuit of FIG. 2, in a first example, wherein if the resistance value of R207 decreases by a fractional amount x, such that the reduced value of R207 is equal to the ideal value of R207*(1−x), the value of Iref will change inversely proportional to the change in R207 resulting in an increase in Iref to Iref/(1−x) since the voltage at N1 does not change. In a second example, if the resistance of R207 increases by a fractional amount y, such that the increased value of R207 is equal to the ideal value of R207*(1+y), the value of Iref will change inversely proportional to the change in 8207 resulting in a decrease in Iref to Iref/(1+y) since the voltage at N1 does not change. The offset current, Ioffset, will vary similar to Iref since Ioffset is mirrored from Iref. The offset voltage produced by the offset current (Ioffset in FIG. 1) through feedback resistor R108 will remain constant since the offset current Ioffset and R108 will vary inversely proportional to each other due to a change in process or temperature.

Figure 3:
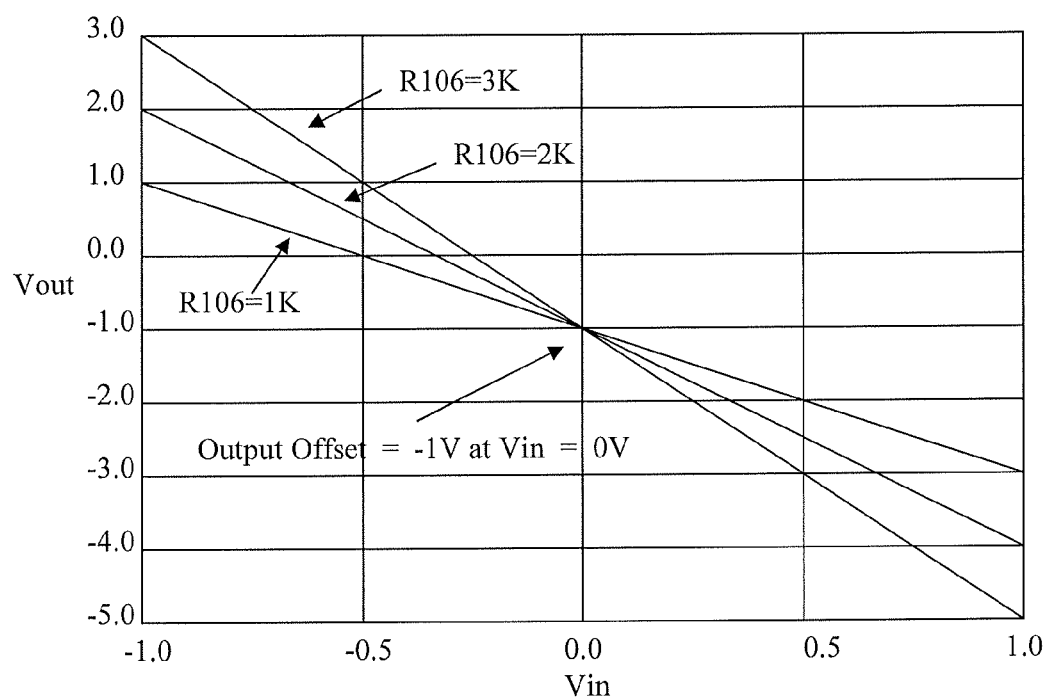
FIG. 3 shows simulated voltage waveforms associated with the amplifier circuit of FIG. 1.

FIG. 3, in an illustrative example, shows simulation results for the circuit architecture of single ended amplifier 100 in FIG. 1 resulting from the superposition of a variable gain and an offset according to an embodiment of the invention. In this example, resistors R104, R106 and R108 are first set to a resistance value of 1 Kohm Resistor R106 is varied from 1 Kohm to 3 Kohm in 1 Kohm steps. Input signal Vin is swept from −1.0V to +1.0V. A 1 mA offset current Ioffset is superimposed onto feedback resistor R108, at the junction of R108 and R106, resulting in an output offset at Vout equal to −1V as can readily be seen in FIG. 3 at an input voltage Vin=0V. As feedback resistor R106 is varied, the slope of the gain varies in accordance with Vout/Vin=(R106+R108)/R104, while the voltage offset remains unaffected at a value equivalent to −Ioffset*R108=−1 mA*1 Kohm=−1V.

Figure 4:
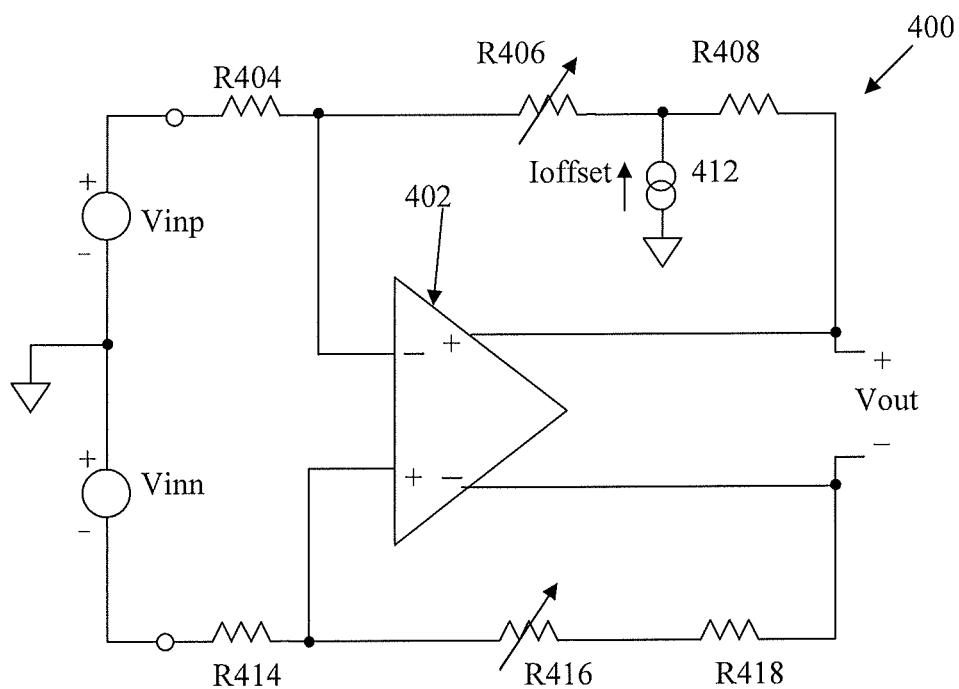
FIG. 4 shows an amplifier circuit including a dc offset cancelation feature according to a second embodiment of the invention.

It is to be appreciated that the dc offset techniques of the invention can be extended to a fully differential operational amplifier circuit, an illustrative embodiment of which is shown in FIG. 4 as exemplary circuit 400.

Again, as in the single ended amplifier, there is no current flowing into the inverting and non-inverting inputs and the differential voltage is nearly zero due to nearly infinite gain of the operational amplifiers. In this case, output common mode circuits within the operational amplifier may set the common mode output voltage while maintaining a differential voltage that is the extension of the single ended case. One advantage of using a fully differential operational amplifier is that common-mode voltages appearing at the inputs of the amplifier are rejected. However, non-common mode dc offsets at the inputs as well as offsets due to mismatched components in the amplifiers will be amplified by the gain of the fully differential operational amplifier. As in the single ended amplifier, input offsets and offsets due to mismatched components can be canceled by feeding a current into the feedback network independent of a programmable gain and different common mode inputs. These advantages are realized by circuit 400.

As shown, circuit 400 in FIG. 4 includes a fully differential operational amplifier circuit 402 (with internal common mode feedback), a first resistor network comprising input resistor R404 and feedback resistors R406 and R408, a second resistor network comprising input resistor R414 and feedback resistors R416 and R418, and offset current source 412. R406 and R408 are series connected feedback resistors with R406 being a variable (adjustable or programmable) resistor. Similarly, R416 and R418 are series connected feedback resistors with R416 being a variable (adjustable or programmable) resistor. The circuit 400 is coupled to a differential pair of input voltage sources Vinp (positive input voltage source) and Vinn (negative input voltage source). The differential signal applied to circuit 400 by voltage sources Vinp and Vinn may have both common mode and differential mode components. Circuit 400 amplifies the differential input signal provided by Vinp and Vinn in order to generate a differential pair of output voltage signals Vout+ and Vout−. More particularly, input resistor R404 has a first terminal coupled to the negative input terminal of differential amplifier 402 and a second terminal coupled to the positive terminal of input voltage source Vinp. R406 and R408 are coupled in series between the output, Vout+, and negative input of differential amplifier 402. That is, a first terminal of R408 is coupled to the output terminal, Vout+, of differential amplifier 402 and a first terminal of R406 is coupled to the negative input terminal of differential amplifier 402. A positive terminal of offset current source 412 is coupled to second terminals of R406 and R408. The negative terminals of Vinp and current source 412 are coupled to ground. Note that the current source 412 generates Ioffset as explained above and, in one embodiment, is implemented as current reference generator 200 in FIG. 2.

On the other side of circuit 400, input resistor R414 has a first terminal coupled to the positive input terminal of differential amplifier 402 and a second terminal coupled to the negative terminal of input voltage source Vinn. R416 and R418 are coupled in series between the output, Vout−, and positive input of differential amplifier 402. That is, a first terminal of R418 is coupled to the output terminal, Vout−, of differential amplifier 402 and a first terminal of R416 is coupled to the positive input terminal of differential amplifier 402. The positive terminal of Vinn is coupled to ground.

As explained above, in this embodiment, current source Ioffset (current source 412) is generated by current reference generator 200 as shown in FIG. 2. Also, in this embodiment, feedback resistors R406, R408, R416 and R418 and input resistors R404 and R414 are made of the same or substantially similar material as current setting resistor R207 in FIG. 2. As in the case of the single ended amplifier described above, an output voltage offset is generated by offset current Ioffset flowing through feedback resistor R408. Alternatively, an offset voltage can be generated by connecting the offset current to the junction of feedback resistors R416 and R418, wherein the offset voltage is equal to the offset current flowing through feedback resistor R418. The offset voltage generated by the offset current Ioffset flowing through feedback resistor R408 (or R418 in alternate embodiment mentioned above) will not vary due to process and temperature changes since the current setting resistor R207 of FIG. 2 is made of the same material as feedback resistor R408 (and R418).

Figure 5:
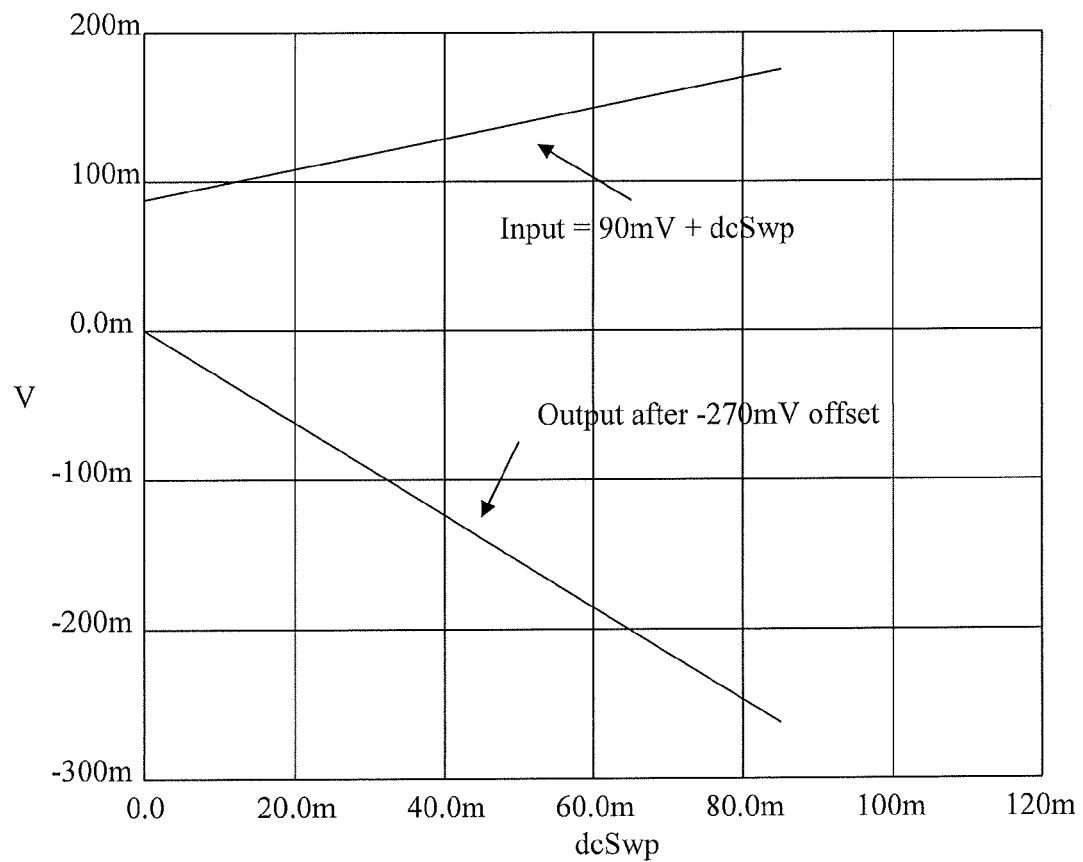
FIG. 5 shows simulated voltage waveforms associated with the amplifier circuit of FIG. 4.

FIG. 5, in an illustrative example, shows simulation results for the circuit architecture of differential amplifier 400 in FIG. 4 resulting from the superposition of an offset voltage according to an embodiment of the invention. In this example, resistors R404, R408, R414 and R418 are set to a resistance value of 36 Kohms. Resistors R406 and R416 are set to a value of 72 Kohms, thereby setting the gain of the differential circuit to 3. The differential input voltage, from the positive terminal of Vinp to the negative terminal of Vinn, is swept from 90 mv to 175 mV, wherein the 90 mV represents a dc offset of the input signal. Without the voltage offset correction, the differential output, Vout, would be 270 mV to 525 mV. Advantageously, the 90 mv input offset voltage, which produces 270 mv on the output due to an amplifier gain of 3, can be subtracted out by superimposing a 7.5 μA offset current (Ioffset) onto feedback resistor R408, at the junction of R408 and R406 in differential amplifier circuit 400 of FIG. 4 (7.5 μA*36 Kohms=270 mV).

Figure 6:
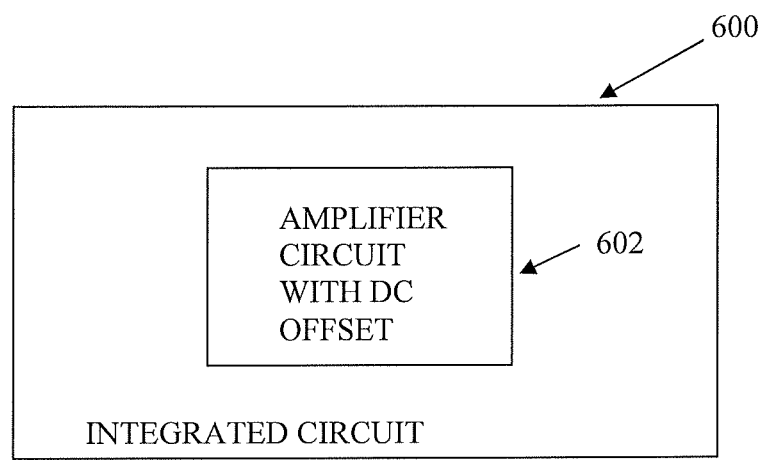
FIG. 6 shows an integrated circuit according to an embodiment of the invention.

FIG. 6 illustrates an integrated circuit (IC) 600 in which the circuits of FIGS. 1, 2 and 4 may be formed. Thus, by way of example, when a single ended amplifier architecture is employed, amplifier circuit with dc offset 602 on IC 600 represents amplifier circuit with dc offset 100 in FIG. 1 and current reference generator 200 in FIG. 2. Of course, in an alternate embodiment with a fully differential amplifier architecture, amplifier circuit with dc offset 602 on IC 600 represents amplifier circuit with dc offset 400 in FIG. 4 and current reference generator 200 in FIG. 2.

It is to be appreciated that, in an integrated circuit implementation of the invention, such as that shown in FIG. 6, one or more integrated circuit dies are typically formed in a pattern on a surface of a wafer. Each such die may include a device comprising circuitry as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention. While circuit 602 is shown in FIG. 6 as being formed in one integrated circuit, it is to be understood that the circuit can be formed across multiple integrated circuits.

Advantageously, as explained herein in detail, when the input signal has a dc component then, according to principles of the invention, this can be subtracted by using an offset cancellation mechanism in the feedback network, which then allows the ac component to be optimized for maximum gain. Further, in accordance with principles of the invention, by using currents that are a function of process, integrated circuit resistors can be used to provide an offset voltage that is independent of process. Also, by using only a portion of the feedback for offsetting, then the feedback can be programmable and still provide offset by virtue of superposition. This is an effective method in a system where common mode at the input of the gain stage is not the same as the output of the gain stage which is generally controlled by common mode feedback.

By way of further advantage, in a fully differential amplifier embodiment, the output common mode voltage can be set different from the input common mode voltage. Therefore, the input common mode voltage can effectively be eliminated from the output. However, the inventive circuit arrangement can still be used to cancel other dc offsets due to non-common mode input offsets as well as for the purpose of nulling systematic offsets that could be generated by random mismatch in the devices making up the op-amp and feedback network.

It is to be further appreciated that principles of the invention provide versatile circuits that can be used in a wide range of applications including, but not limited to, hard disk drive applications, analog-to-digital conversion (ADC) applications, and null circuit applications. Other applications could include any application with a signal with both a dc component and an ac component where the dc component could be removed without the need for a capacitor.

For example, in a hard disk drive application, the inventive circuit removes the dc component from an element that is biased with dc in order to measure a resistance. The resistance being measured is across an element in the hard disk drive used to measure the proximity of a read/write head to the disk surface (resistance changes with distance). Advantageously, the circuit removes the dc component so that the gain for the ac component can be increased.

In the ADC example, one may want to change the dc reference from the input to the output. The inventive circuit can be used to accomplish this task.

While the above applications use the circuit to operate on the applied signal, another application could include a null circuit for an amplifier. For example, in such a case, the input signal is shorted and the offset current could be changed with a digital-to-analog converter so that the output is driven as close as possible to zero in order to cancel offsets in the amplifier circuit.

Of course, it is to be understood that the above-mentioned applications are for illustrative purposes only in order to demonstrate the wide ranging application of the inventive circuits and methodologies described herein.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention. By way of example only, the feedback resistor networks shown in FIGS. 1 and 4 could be arranged in alternate configurations depending on the particular integrated circuit configuration used to implement the amplifier circuits. Further, the current reference generator in FIG. 2 could be implemented in alternative configurations so long as it produces an offset current that generates a voltage in the feedback resistor network that cancels the offset component present in the input signal received by the amplifier circuit, as explained herein.

What is claimed is:

1. An apparatus comprising:
   an amplifier circuit with an amplifier element and a feedback resistor network coupled between an output of the amplifier element and an input of the amplifier element; and
   a current source coupled to the feedback resistor network, the current source generating a current signal that generates a voltage in a first portion of the feedback resistor network that cancels an offset component present in an input signal received by the amplifier circuit.

2. The apparatus of claim 1, wherein a second portion of the feedback resistor network is adjustable so that a gain applied to the input signal is adjustable while the offset component is canceled from the input signal.

3. The apparatus of claim 1, wherein the offset component present in an input signal received by the amplifier circuit comprises a direct current component.

4. The apparatus of claim 1, wherein one or more resistors in the feedback resistor network are composed of the same or a substantially similar material as one or more resistive elements associated with the current source.

5. The apparatus of claim 4, wherein the voltage generated in the first portion of the feedback resistor network that cancels the offset component present in the input signal received by the amplifier circuit is independent of a temperature variation.

6. The apparatus of claim 4, wherein the voltage generated in the first portion of the feedback resistor network that cancels the offset component present in the input signal received by the amplifier circuit is independent of a process variation.

7. The apparatus of claim 1, wherein the amplifier circuit is a single ended amplifier circuit.

8. The apparatus of claim 1, wherein the amplifier circuit is a fully differential amplifier circuit.

9. The apparatus of claim 1, wherein the current source further comprises:
   a current reference generation circuit generating a reference current signal; and
   a current mirror circuit coupled to the current reference generation circuit, the current mirror circuit, in response to the reference current signal, generating the current signal that generates the voltage in the first portion of the feedback resistor network that cancels the offset component present in the input signal received by the amplifier circuit.

10. The apparatus of claim 9, wherein the current reference generation circuit comprises a bandgap reference source, an amplifier element coupled to the bandgap reference source, and a feedback circuit coupled to the amplifier element.

11. The apparatus of claim 10, wherein the feedback circuit of the current reference generation circuit comprises a transistor and a resistor coupled to the transistor.

12. The apparatus of claim 11, wherein the resistor in the feedback circuit of the current reference generation circuit is adjustable so as to adjust the reference current signal.

13. The apparatus of claim 9, wherein the current mirror circuit comprises a first transistor and a second transistor for generating a current signal that is a scaled amount of the reference current signal.

14. An integrated circuit comprising:
   a first part of the integrated circuit forming an amplifier circuit with an amplifier element and a feedback resistor network coupled between an output of the amplifier element and an input of the amplifier element; and
   a second part of the integrated circuit forming a current source coupled to the feedback resistor network, the current source generating a current signal that generates a voltage in a first portion of the feedback resistor network that cancels an offset component present in an input signal received by the amplifier circuit.

15. The integrated circuit of claim 14, wherein a second portion of the feedback resistor network is adjustable so that a gain applied to the input signal is adjustable while the offset component is canceled from the input signal.

16. The integrated circuit of claim 14, wherein the offset component present in an input signal received by the amplifier circuit comprises a direct current component.

17. The integrated circuit of claim 14, wherein one or more resistors in the feedback resistor network are composed of the same or a substantially similar material as one or more resistive elements associated with the current source.

18. The integrated circuit of claim 17, wherein the voltage generated in the first portion of the feedback resistor network that cancels the offset component present in the input signal received by the amplifier circuit is independent of a temperature variation.

19. The integrated circuit of claim 17, wherein the voltage generated in the first portion of the feedback resistor network that cancels the offset component present in the input signal received by the amplifier circuit is independent of a process variation.

20. A method comprising:
generating a current signal that generates a voltage in a first portion of a feedback resistor network of an amplifier circuit that comprises an amplifier element whereby the feedback resistor network is coupled between an output of the amplifier element and an input of the amplifier element, the generated voltage canceling an offset component present in an input signal received by the amplifier circuit.

* * * * *